United States Patent
Shim et al.

(10) Patent No.: US 9,643,212 B2
(45) Date of Patent: May 9, 2017

(54) CAPACITIVE MICROMACHINED ULTRASONIC TRANSDUCER MODULE USING WIRE-BONDING

(71) Applicant: SAMSUNG ELECTRONICS CO., LTD., Suwon-si (KR)

(72) Inventors: Dongsik Shim, Hwaseong-si (KR); Seogwoo Hong, Yongin-si (KR); Seokwhan Chung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 226 days.

(21) Appl. No.: 14/665,555

(22) Filed: Mar. 23, 2015

(65) Prior Publication Data
US 2016/0016197 A1    Jan. 21, 2016

(30) Foreign Application Priority Data
Jul. 16, 2014 (KR) .......................... 10-2014-0089897

(51) Int. Cl.
*B06B 1/02*    (2006.01)
(52) U.S. Cl.
CPC ................... *B06B 1/0292* (2013.01)
(58) Field of Classification Search
CPC .................................................. B06B 1/0292
See application file for complete search history.

(56) References Cited

U.S. PATENT DOCUMENTS

| 8,483,014 B2 | 7/2013 | Huang | |
|---|---|---|---|
| 2008/0269614 A1* | 10/2008 | Adachi | A61B 8/00 367/181 |
| 2016/0016197 A1* | 1/2016 | Shim | B06B 1/0292 367/181 |
| 2016/0020709 A1* | 1/2016 | Shim | B06B 1/0292 310/300 |
| 2016/0045935 A1* | 2/2016 | Yoon | B06B 1/0292 310/309 |
| 2016/0051226 A1* | 2/2016 | Hong | B06B 1/0292 600/459 |

FOREIGN PATENT DOCUMENTS

| JP | 3776519 B2 | 5/2006 |
|---|---|---|
| JP | 4961224 B2 | 6/2012 |
| KR | 10-2011-0066304 A | 6/2011 |
| KR | 10-2014-0003720 A | 1/2014 |

* cited by examiner

*Primary Examiner* — Daniel Pihulic
(74) *Attorney, Agent, or Firm* — Sughrue Mion, PLLC (57) ABSTRACT

Provided are capacitive micromachined ultrasonic transducer (CMUT) modules. A CMUT module includes a CMUT chip which includes a plurality of first electrode pads on a first surface thereof; a flexible printed circuit (FPC) which is disposed on the first surface of the CMUT chip, the FPC including a plurality of first holes which are configured to expose the plurality of first electrode pads; a plurality of second electrode pads formed on the FPC so as to correspond to the plurality of first electrode pads; and a plurality of wires which connect each respective one of the plurality of first electrode pads to the corresponding one of the plurality of second electrode pads.

9 Claims, 6 Drawing Sheets

CAPACITIVE MICROMACHINED ULTRASONIC TRANSDUCER MODULE USING WIRE-BONDING

CROSS-REFERENCE TO RELATED APPLICATION

This application claims priority from Korean Patent Application No. 10-2014-0089897, filed on Jul. 16, 2014, in the Korean Intellectual Property Office, the disclosure of which is incorporated herein by reference in its entirety.

BACKGROUND

1. Field

Exemplary embodiments relate to capacitive micromachined ultrasonic transducer modules in which a capacitive micromachined ultrasonic transducer chip and a flexible printed circuit are bonded by wire bonding.

2. Description of the Related Art

A capacitive micromachined ultrasonic transducer (CMUT) is a transducer that converts an electrical signal to an ultrasonic signal or vice versa.

In order to fabricate an ultrasonic probe, a CMUT is bonded to an electrical circuit. The bonding method may include wire bonding and flip chip bonding. When a flip chip bonding method is used to connect a CMUT to a flexible printed circuit (FPC), the bonding method is complicated, and manufacturing costs may be relatively high as a result. In addition, an alignment error between the CMUT and the FPC may occur, and this alignment error may not be readily detected in the bonding method.

When a wire bonding method is used, an area required for wire bonding may be increased, and accordingly, an effective area of the CMUT may be decreased in an ultrasonic probe. As a result, measuring quality may be decreased.

SUMMARY

Provided are capacitive micromachined ultrasonic transducer modules having a CMUT chip with an increased effective area by wire bonding a flexible printed circuit (FPC) to an electrode pad of the CMUT chip through a hole in the FPC.

Additional aspects will be set forth in part in the description which follows and, in part, will be apparent from the description, or may be learned by practice of the presented exemplary embodiments.

According to an aspect of one or more exemplary embodiments, a micromachined ultrasonic transducer (CMUT) module includes: a CMUT chip which includes a plurality of first electrode pads which are disposed on a first surface thereof; a flexible printed circuit (FPC) which is disposed on the first surface of the CMUT chip, the FPC including a plurality of first holes which are configured to expose the plurality of first electrode pads; a plurality of second electrode pads which are formed on the FPC and which correspond to respective ones of the plurality of first electrode pads; and a plurality of wires which connect each respective one of the plurality of first electrode pads to the corresponding one of the plurality of second electrode pads.

The CMUT chip may include a plurality of channels disposed in a first direction, each channel may include at least two first electrode pads that are separated by a predetermined distance in a second direction which is perpendicular to the first direction, and the first electrode pads of adjacent channels are separated by a predetermined gap in the second direction.

The CMUT module may further include a plurality of lead wires that are respectively connected to second electrode pads on both facing sides of the FPC, wherein the lead wires are substantially parallel to each other.

The CMUT module may further include a plurality of connection wires which respectively connect the at least two first electrode pads of each respective one of the plurality of channels in the second direction, wherein each respective one of the plurality of channels includes one second electrode pad which is connected to the corresponding one of the plurality of connection wires.

A first number of lead wires may be substantially equal to a second number of connection wires.

The first hole may be a slit that crosses at least one adjacent channel in the first direction.

The CMUT chip has a first area, and a main body of the FPC has a second area, and the first area may be substantially equal to the second area.

An area of each respective one of the plurality of first electrode pads may be greater than an area of each corresponding one of the plurality of second electrode pads.

Each of the plurality of first holes may have a respective length in a range from about 0.2 millimeters to about 1.0 millimeters.

BRIEF DESCRIPTION OF THE DRAWINGS

These and/or other aspects will become apparent and more readily appreciated from the following description of exemplary embodiments, taken in conjunction with the accompanying drawings in which.

DETAILED DESCRIPTION

Reference will now be made in detail to exemplary embodiments, examples of which are illustrated in the accompanying drawings. In the drawings, the thicknesses of layers and regions are exaggerated for clarity. The present inventive concept may, however, be embodied in many different forms and should not construed as limited to the exemplary embodiments set forth herein. It will also be understood that when an element is referred to as being "above" or "on" another element, it can be directly on the other element or intervening layers may also be present.

Like reference numerals in the drawings denote like elements throughout the specification, and thus their description will be omitted.

Figure 1:
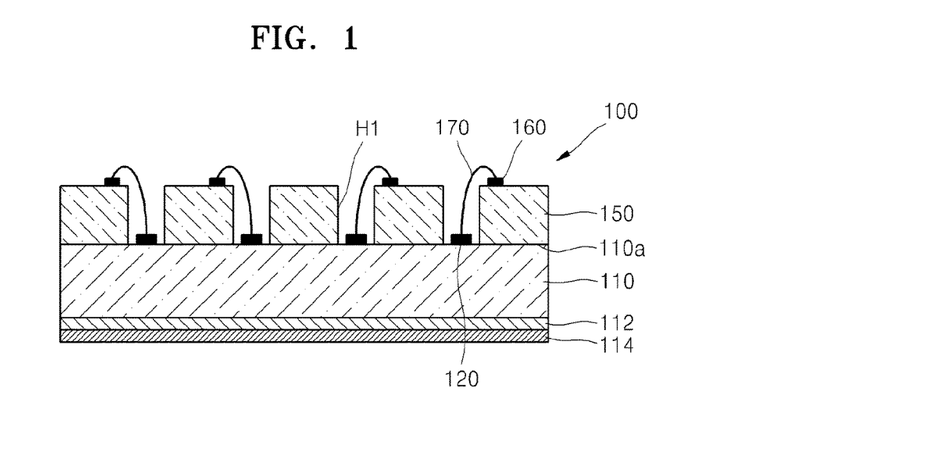
FIG. 1 is a schematic cross-sectional view of a structure of a capacitive micromachined ultrasonic transducer (CMUT) module, according to one or more exemplary embodiments.

FIG. 1 is a schematic cross-sectional view of a structure of a capacitive micromachined ultrasonic transducer (CMUT) module 100, according to one or more exemplary embodiments.

Referring to FIG. 1, the CMUT module 100 includes a CMUT chip 110 and a flexible printed circuit (FPC) 150. First electrode pads 120 which are configured for electrical connection of elements are formed on a first surface 110a of the CMUT chip 110, which is opposite to an active surface on which a membrane 112 is formed. The FPC 150 is formed on the first surface 110a of the CMUT chip 110. The FPC 150 may be attached to the CMUT chip 110 by using a polymer adhesive. The membrane 112 and an upper electrode 114, which is a common electrode, may be sequentially stacked on the active surface of the CMUT chip 110.

Figure 2:
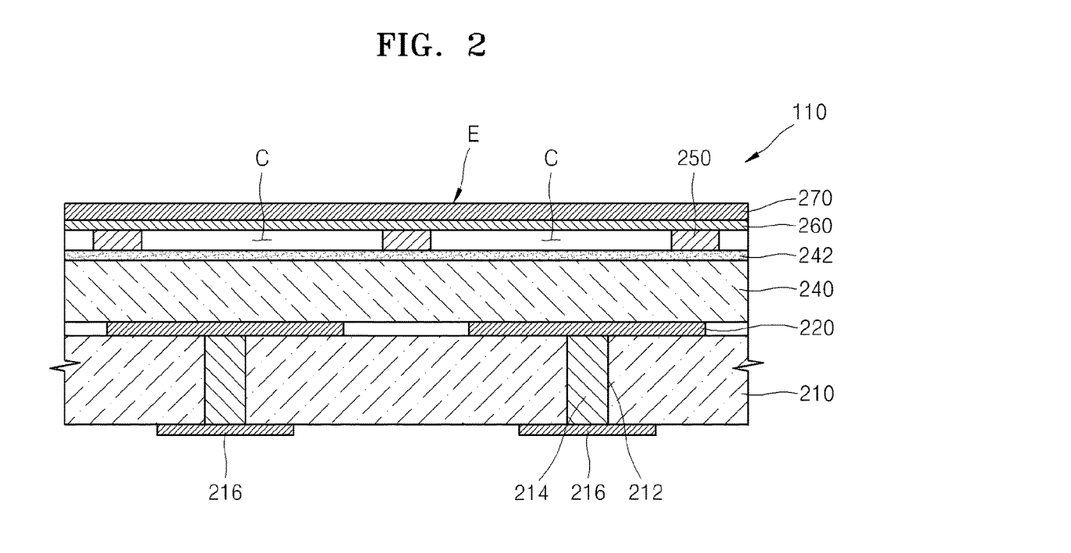
FIG. 2 is a cross-sectional view showing an example of a CMUT chip of FIG. 1, according to one or more exemplary embodiments.

FIG. 2 is a cross-sectional view showing an example of the CMUT chip 110 of FIG. 1.

Referring to FIG. 2, the CMUT chip 110 may include a through-silicon via (TSV) substrate 210 and a device substrate 240 that is bonded to the TSV substrate 210. The TSV substrate 210 and the device substrate 240 may be bonded by performing a eutectic bonding process.

The TSV substrate 210 may be formed of silicon and may include a plurality of through holes 212 therein. The CMUT chip 110 may include a plurality of elements E. The through holes 212 may correspond to the elements E. An insulation layer (not shown) may be formed on an inner surface of the through holes 212 and a surface of the TSV substrate 210. A via metal 214 is filled in each of the through holes 212.

The device substrate 240 is formed of a conductive material and may have a thickness of a few tens of micrometers (μm), such as, for example, in a range from about 10 μm to about 50 μm. The device substrate 240 may be formed of low resistance silicon that is highly doped with an impurity. The device substrate 240 may be used as a lower electrode.

The device substrate 240 may include an insulation layer 242, a supporting unit 250 that forms cavities C, and a membrane 260 disposed on the supporting unit 250 so as to cover the cavities C. An upper electrode 270 may be formed on the membrane 260. The membrane 260 may be formed of silicon. The supporting unit 250 may be formed of an insulation material. The supporting unit 250 may include oxide or nitride. The supporting unit 250 may be formed of, for example, silicon oxide.

In FIG. 2, the insulation layer 242 is formed on an upper surface of the device substrate 240. However, the current exemplary embodiment is not limited thereto. For example, the insulation layer 242 may be formed between the membrane 260 and the supporting unit 250.

The upper electrode 270 may be formed of any one or more of gold (Au), copper (Cu), tin (Sn), silver (Ag), aluminum (Al), platinum (Pt), titanium (Ti), nickel (Ni), chromium (Cr), or a mixture of these materials.

The insulation layer 242 may include oxide or nitride. The insulation layer 242 may be formed of, for example, silicon nitride.

In FIG. 2, two cavities C are included in one element E. However, the current exemplary embodiment is not limited thereto. For example, one or a plurality of cavities C may be formed in one element E.

Bonding pads 220 are formed on a lower surface of the device substrate 240 and connected to via metals 214. The bonding pads 220 may be formed of a eutectic bonding metal, for example, an Au—Sn eutectic material.

First electrode pads 216 are formed on a lower surface of the TSV substrate 210 and connected to the via metals 214. A driving voltage may be applied to the first electrode pads 216. A ground voltage may be applied to the upper electrode 270.

Referring to FIG. 1, the FPC 150 has a plurality of first holes H1. The first holes H1 expose their corresponding first electrode pads 120. Second electrode pads 160 are formed on a surface of the FPC 150 which is opposite the CMUT chip 110 to correspond to the first electrode pads 120. The second electrode pads 160 are bonded to the first electrode pads 120 by wires 170. Since the wire bonding starts from the second electrode pads 160 towards the first electrode pads 120, the second electrode pads 160 may be formed on a smaller area than the first electrode pads 120.

Figure 3:
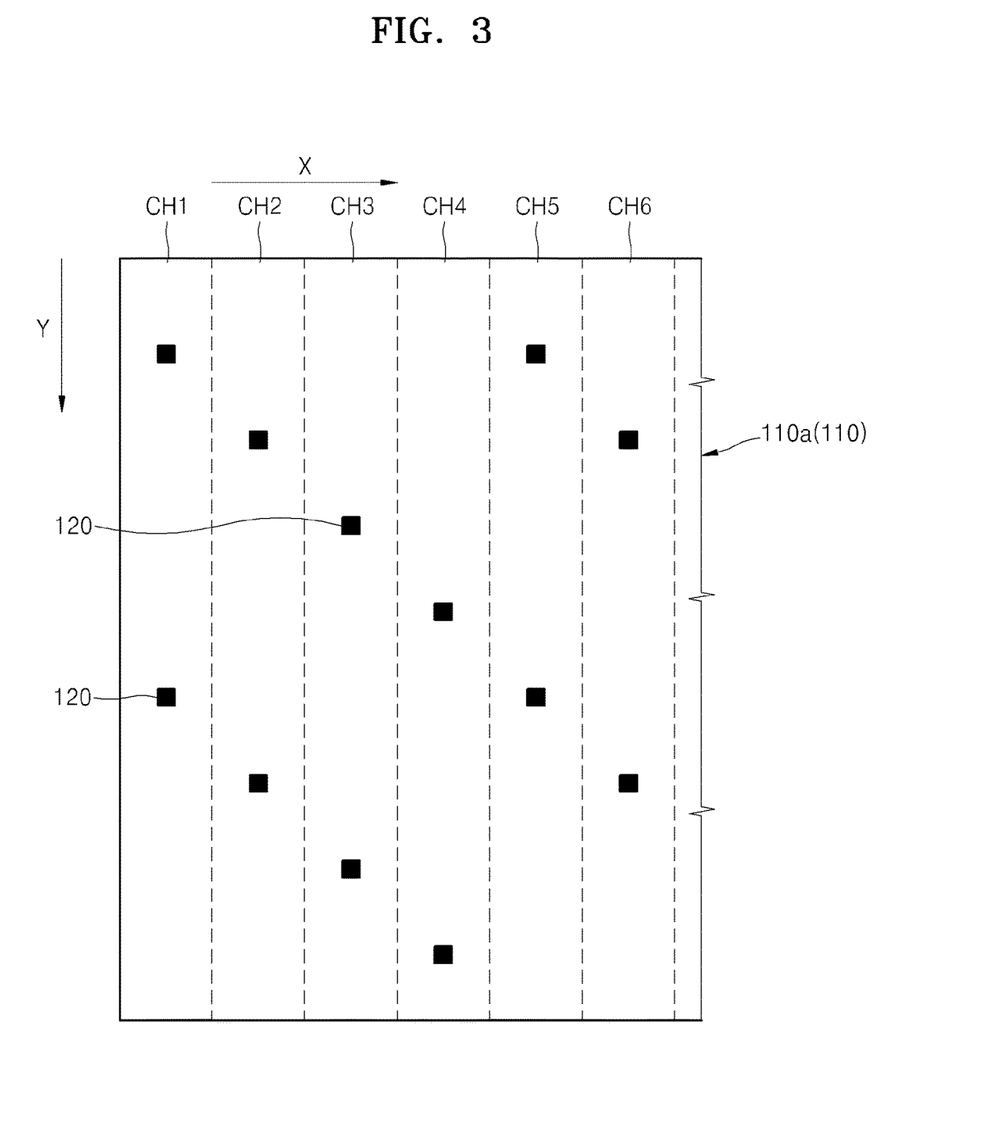
FIG. 3 is a plan view of the CMUT chip of FIG. 1, according to one or more exemplary embodiments.

FIG. 3 is a plan view of the CMUT chip 110 of FIG. 1, according to one or more exemplary embodiments. Like reference numerals are used to indicate elements that are substantially identical to the elements of FIGS. 1 and 2, and thus the detailed descriptions thereof will not be repeated.

Referring to FIG. 3, the plurality of first electrode pads 120 are formed on the first surface 110a of the CMUT chip 110. The CMUT chip 110 may include a plurality of channels, for example, 80 channels or 128 channels. The channels may be one dimensionally disposed. Hereinafter, the CMUT chip 110 having 80 channels will be described.

The 80 channels may be sequentially formed in a first direction (i.e., in FIG. 3, the direction indicated by an arrow X). In FIG. 3, for convenience of explanation, only 6 channels CH1~CH6 are depicted. A single element E may be formed on each of the channels. One or a plurality of first electrode pads 120 for power supply may be formed on each channel. In FIG. 3, each channel includes two first electrode pads 120. The reason for a number of first electrode pads 120 which is greater than one, such as, for example, two first electrode pads 120 to be formed on each of the channel is, if one of the first electrode pads 120 electrically fails, a power supply may be achieved through the other first electrode pad 120. The first electrode pads 120 correspond to the first electrode pads 216 of FIG. 2.

As depicted in FIG. 3, the first electrode pads 120 formed on one channel are uniformly separated from each other with respect to a second direction (i.e., in FIG. 3, the direction indicated by an arrow Y) in order to ensure spaces between the adjacent channels. For example, the four adjacent channels may be formed to be uniformly separated in the first and second directions, and this disposition may be repeated.

At least another electrode pad (not shown) may be separately formed from the first electrode pads 120 to apply a ground voltage to the upper electrode (114 in FIG. 1) of the CMUT chip 110.

Figure 4:
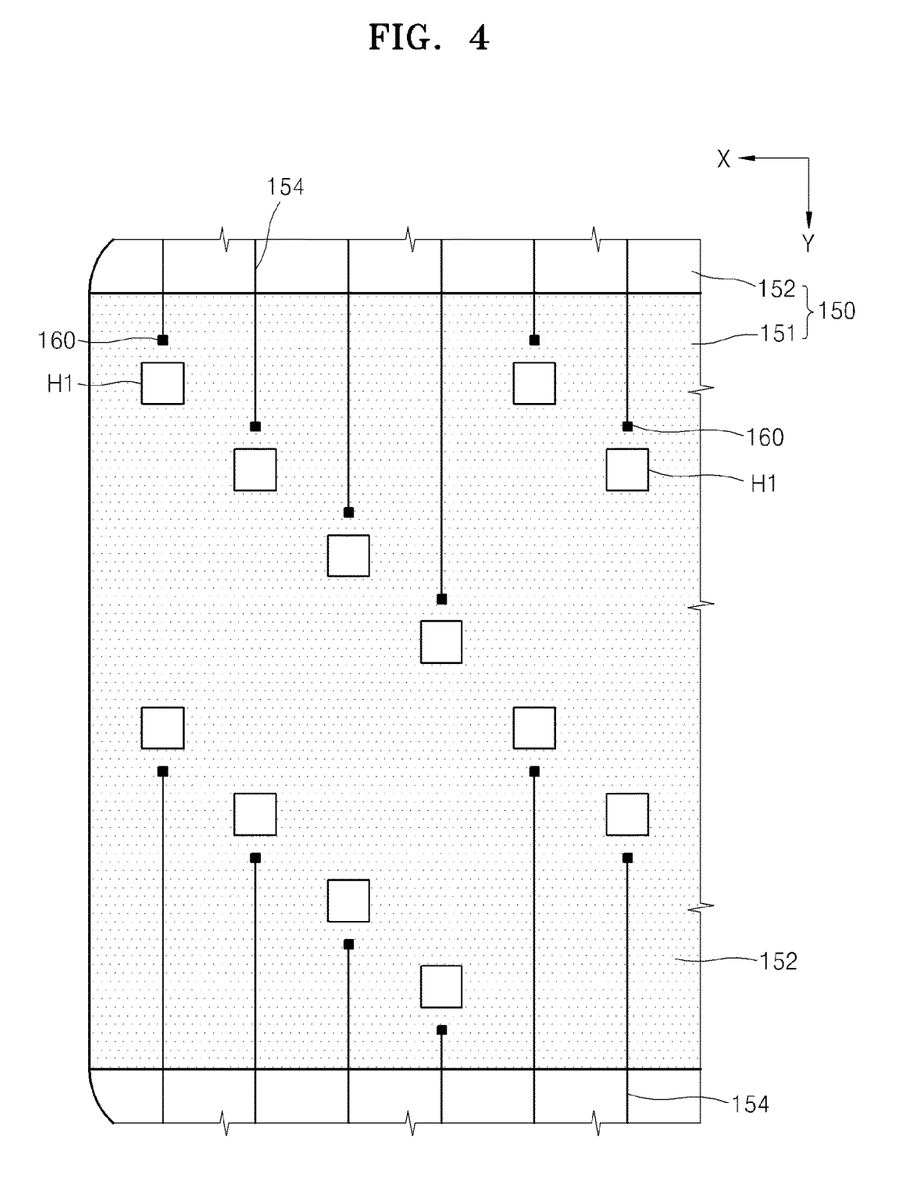
FIG. 4 is a plan view of a portion of the FPC of FIG. 1, according to one or more exemplary embodiments.

FIG. 4 is a plan view of a portion of the FPC 150 of FIG. 1, according to one or more exemplary embodiments.

Referring to FIG. 4, the second electrode pads 160 may be formed on the FPC 150 to correspond to the first electrode pads 120. The first holes H1 may be formed adjacent to the second electrode pads 160 to correspond to the second electrode pads 160. The first holes H1 may have a shape which is approximately rectangular. The first holes H1 may have a size (length) in a range from about 0.2 mm to about 10 mm approximately, which length is measurable in the second direction. Lead wires 154 for implementing respective electrical connections to the second electrode pads 160 are disposed on both facing sides of the FPC 150. The lead wires 154 are connected to the corresponding second electrode pads 160. The lead wires 154 may be connected to the second electrode pads 160 almost in straight lines and parallel to each other.

The FPC 150 may include a main body 151 and a lead unit 152 in which the lead wires 154 are included. When a CMUT probe is fabricated, the main body 151 of the FPC 150 is combined with the CMUT chip 110 when the lead unit 152 is backwardly bent. Accordingly, the CMUT chip 110 and the main body 151 of the FPC 150 may have substantially the same area, and thus, an effective area of the CMUT chip 110 may be maximized.

Figure 5:
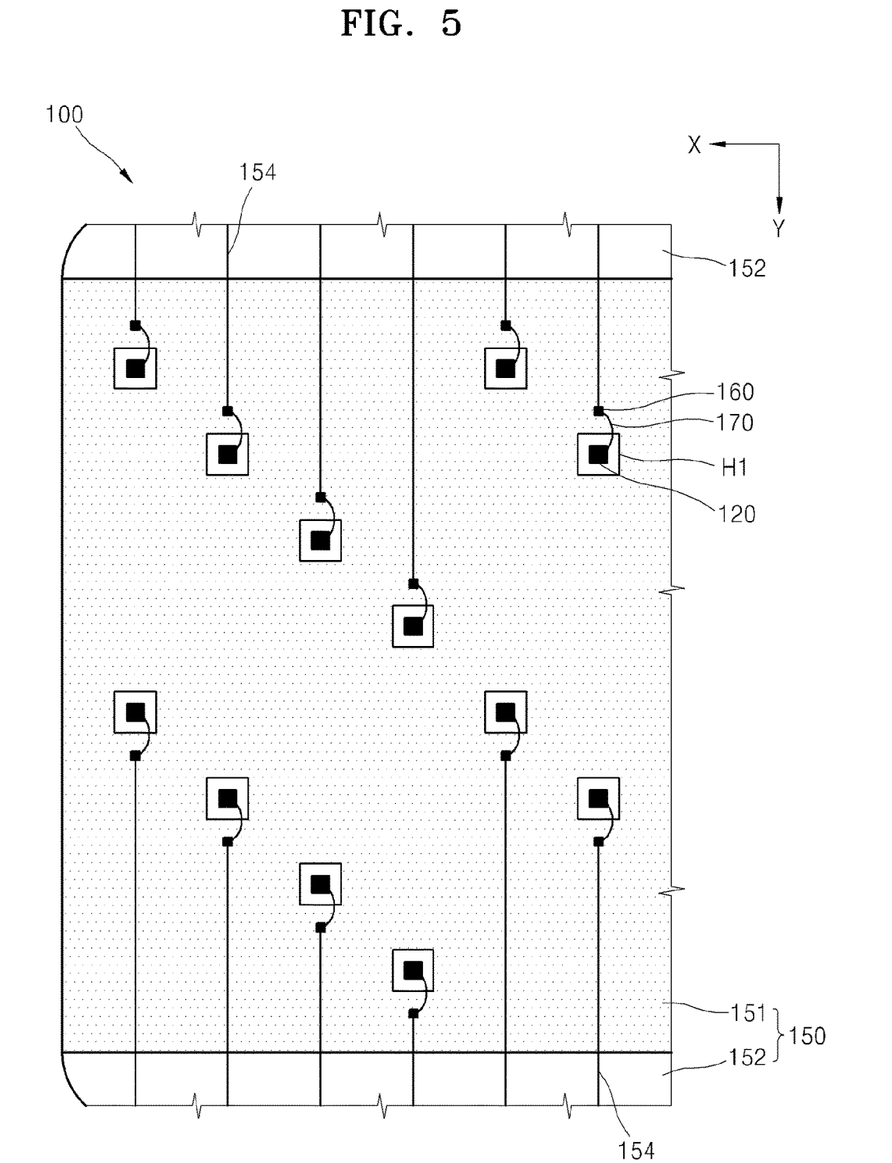
FIG. 5 is a plan view of the schematic cross-sectional view of FIG. 1, according to one or more exemplary embodiments.

FIG. 5 is an example plan view of the CMUT module structure illustrated in FIG. 1.

Referring to FIG. 5, the CMUT module 100 may include the FPC 150 disposed on the CMUT chip 110. The first holes H1 are disposed so as to expose the first electrode pads 120. The wires 170 are disposed between the first electrode pads 120 and the second electrode pads 160 and configured to connect the first electrode pads 120 to the second electrode pads 160. When wire bonding, the wires 170 start from the second electrode pads 160 and extend towards the first electrode pads 120, and thus, the second electrode pads 160 may have a smaller area than the first electrode pads 120.

In the CMUT module 100, the first holes H1 are formed in the FPC 150, and the second electrode pads 160 may be wire-bonded to the first electrode pads 120 of the CMUT chip 110 through the first holes H1. The wire bonding allows for easy fabrication of the CMUT module 100. Since the first electrode pads 120 are formed relatively larger than the second electrode pads 160, even though an alignment error may occur between the CMUT chip 110 and the FPC 150, the wire bonding may be readily achieved. In addition, an alignment error may be readily detected through the first holes H1.

Further, since the CMUT chip 110 may be formed on a substantially same area of the main body 151 of the FPC 150, an effective area of the CMUT chip 110 may be increased in an ultrasonic probe, and accordingly, the measuring quality of the CMUT module 100 may be increased.

Figure 6:
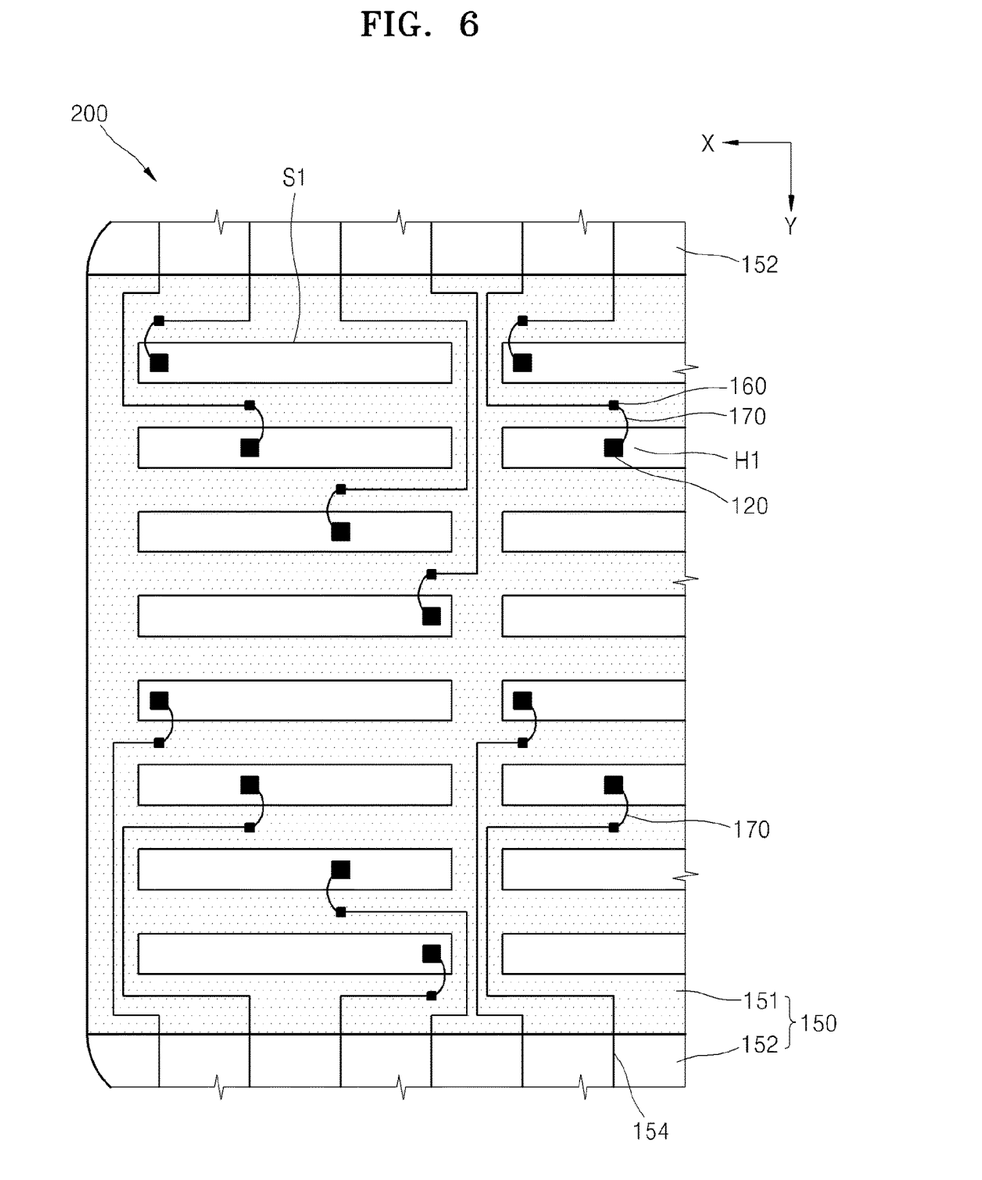
FIG. 6 is a plan view of a CMUT module, according to one or more exemplary embodiments.

FIG. 6 is a plan view of a CMUT module 200, according to one or more exemplary embodiments. Like reference numerals are used to indicate elements that are substantially identical to the elements of the CMUT module 100 of FIG. 5, and thus the detailed descriptions thereof will not be repeated.

Referring to FIG. 6, slits S1 having a longer length in the first direction X (as compared with the length in the second direction Y) are formed on the FPC 150. Each of the slits S1 may have a shorter length that is approximately in a range from about 0.2 mm to about 1.0 mm in the second direction Y. The lead wires 154 may be connected to the second electrode pads 160 by making a detour around the slits S1 and not overlapping with other lead wires 154, as illustrated in FIG. 6. The slits S1 allow easy wire bonding between the first electrode pads 120 and the second electrode pads 160.

Figure 7:
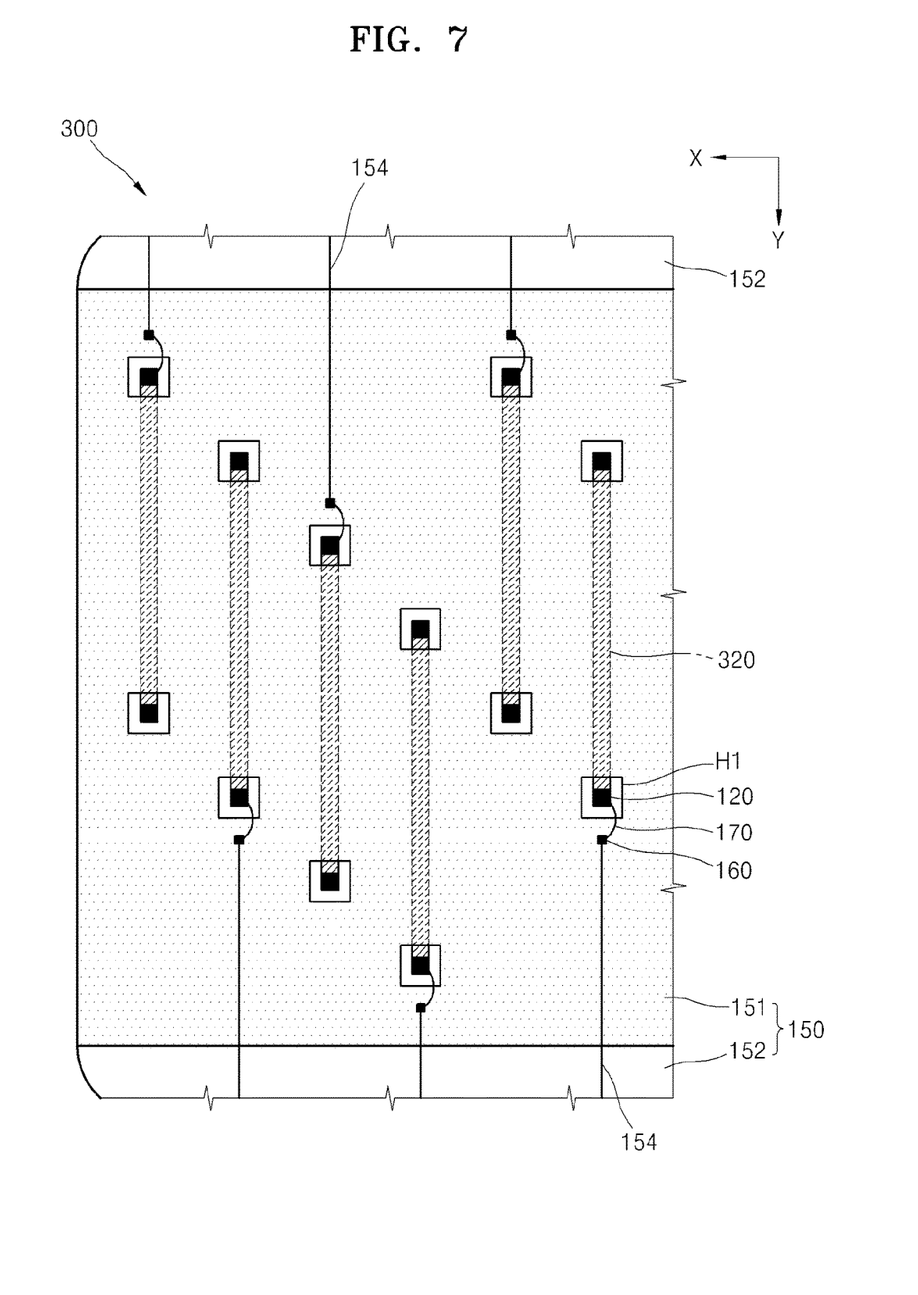
FIG. 7 is a plan view of a CMUT module, according to one or more exemplary embodiments.

FIG. 7 is a plan view of a CMUT module 300, according to one or more exemplary embodiments.

Referring to FIG. 7, the first electrode pads 120 of each channel are connected to each other by a connection wire 320. The connection wire 320 may be formed by patterning a metal layer together with the first electrode pads 120 in a process of forming the first electrode pads 120.

In the FPC 150, the first holes H1 may be formed adjacent to the first electrode pads 120. The slits S1 in FIG. 6 may be formed instead of the first holes H1. The second electrode pads 160 are connected to the first electrode pads 120 via respective wires 170. In each channel, only one first hole H1 may be formed on a side of both facing sides of the FPC 150, and the second electrode pad 160 may be formed closer to the corresponding first hole H1.

The number of lead wires 154 that connect the first electrode pads 120 is reduced by half, and accordingly, the design of the lead wires 154 may be easier. Accordingly, the number of lead wires 154 may be substantially equal to the number of connection wires 320.

However, the current exemplary embodiment is not limited thereto. For example, in the structure of FIG. 5, the connection wires 320 that connect the first electrode pads 120 may further be included.

In the CMUT module that uses wire bonding according to one or more exemplary embodiments, the first holes H1 are formed in the FPC, and wire bonding between the first electrode pads 120 of the CMUT chip 110 and the second electrode pads on the FPC is performed through the first holes H1. The wire bonding enables easy fabrication of the CMUT module. In addition, since the first electrode pads are formed relatively larger than the second electrode pads 160, even if an alignment error between the CMUT chip and the FPC occurs, the wire bonding may be easily performed. Further, the alignment error may be readily detected through the first holes H1.

Still further, since the CMUT chip may be formed on substantially the same area as the main body 151 of the FPC 150, an effective area of the CMUT chip in the CMUT module may be increased, and thus, the measuring quality of the CMUT module may be increased.

While exemplary embodiments have been described with reference to the figures, it will be understood by those of ordinary skill in the art that various changes in form and details may be made therein without departing from the spirit and scope of the present inventive concept, as defined by the following claims.

What is claimed is:

1. A capacitive micromachined ultrasonic transducer (CMUT) module comprising:
   a CMUT chip which comprises a plurality of first electrode pads which are disposed on a first surface thereof;
   a flexible printed circuit (FPC) which is disposed on the first surface of the CMUT chip, the FPC comprising a plurality of first holes which are configured to expose the plurality of first electrode pads;
   a plurality of second electrode pads which are formed on the FPC and which correspond to respective ones of the plurality of first electrode pads; and
   a plurality of wires which connect each respective one of the plurality of first electrode pads to the corresponding one of the plurality of second electrode pads.

2. The CMUT module of claim 1, wherein the CMUT chip comprises a plurality of channels disposed in a first direction, each of the plurality of channels comprising at least two first electrode pads that are separated by a predetermined distance in a second direction which is perpendicular to the first direction, and wherein the first electrode pads of adjacent channels are separated by a predetermined gap in the second direction.

3. The CMUT module of claim 2, further comprising a plurality of lead wires which are respectively connected to the plurality of second electrode pads on both facing sides of the FPC, wherein the plurality of lead wires are substantially parallel to each other.

4. The CMUT module of claim 2, further comprising a plurality of connection wires which respectively connect the at least two first electrode pads of each respective one of the plurality of channels in the second direction, wherein each respective one of the plurality of channels includes one second electrode pad which is connected to the corresponding one of the plurality of connection wires.

5. The CMUT module of claim 4, further comprising a plurality of lead wires which are respectively connected to the plurality of second electrode pads on both facing sides of the FPC, wherein a first number of the plurality of lead wires is substantially equal to a second number of the plurality of connection wires.

6. The CMUT module of claim 2, wherein each of the plurality of first holes is a slit which crosses at least one adjacent channel in the first direction.

7. The CMUT module of claim 1, wherein the CMUT chip has a first area, and a main body of the FPC has a second area which is substantially equal to the first area.

8. The CMUT module of claim 1, wherein an area of each respective one of the plurality of first electrode pads is greater than an area of each corresponding one of the plurality of second electrode pads.

9. The CMUT module of claim 1, wherein each of the plurality of first holes has a respective length in a range from about 0.2 millimeters to about 1.0 millimeters.

* * * * *